United States Patent
Kobayashi et al.

(10) Patent No.: US 7,789,316 B2
(45) Date of Patent: Sep. 7, 2010

(54) ELECTRONIC DEVICE, ELECTRONIC APPARATUS MOUNTED WITH ELECTRONIC DEVICE, ARTICLE EQUIPPED WITH ELECTRONIC DEVICE AND METHOD OF PRODUCING ELECTRONIC DEVICE

(75) Inventors: Hiroshi Kobayashi, Kawasaki (JP); Kenji Kobae, Kawasaki (JP); Shuichi Takeuchi, Kawasaki (JP); Hidehiko Kira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/559,202

(22) Filed: Sep. 14, 2009

(65) Prior Publication Data

US 2010/0001081 A1    Jan. 7, 2010

Related U.S. Application Data

(63) Continuation of application No. PCT/JP2007/056079, filed on Mar. 23, 2007.

(51) Int. Cl.
*G06K 19/06* (2006.01)
(52) U.S. Cl. .......................... 235/492; 257/679; 257/712
(58) Field of Classification Search ................. 235/492; 257/679, 712
See application file for complete search history.

(56) References Cited

U.S. PATENT DOCUMENTS

| | | | |
|---|---|---|---|
| 6,406,990 B1 | 6/2002 | Kawai | |
| 6,627,990 B1 * | 9/2003 | Shim et al. | 257/712 |
| 6,664,645 B2 | 12/2003 | Kawai | |

2002/0115278 A1    8/2002    Kawai

FOREIGN PATENT DOCUMENTS

| | | |
|---|---|---|
| DE | 19519899 A1 | 12/1996 |
| EP | 0745955 A2 | 12/1996 |
| JP | 55-004917 A | 1/1980 |
| JP | 60-018934 A | 1/1985 |
| JP | 61-086886 A | 5/1986 |
| JP | 02-255391 A | 10/1990 |
| JP | 09-118087 A | 5/1997 |
| JP | 2001-156110 A | 6/2001 |
| JP | 2003-108964 A | 4/2003 |

OTHER PUBLICATIONS

Notification of Transmittal of Copies of Translation of the International Preliminary Report on Patentability (Form PCT/IB/338) of International Application No. PCT/JP2007/056079 mailed Oct. 8, 2009, with forms PCT/IB/373, and PCT/ISA/237.
International Search Report of PCT/JP2007/056079, Mailing Date of Jun. 19, 2007.

* cited by examiner

*Primary Examiner*—Michael G Lee
*Assistant Examiner*—Kristy A Haupt
(74) *Attorney, Agent, or Firm*—Westerman, Hattori, Daniels & Adrian, LLP

(57) ABSTRACT

An electronic device includes: a base; a conductor pattern formed on the base; a circuit chip electrically connected to the conductor pattern; and a reinforcing member which is disposed on the base to surround the circuit chip, whose outer shape is like a ring, and which has such an internal structure that a plurality of columns extending in the thickness direction of the base are dispersed in a predetermined substrate. The electronic device further includes a sealing member which fills an inside of the reinforcing member while covering the top of the circuit chip, thereby sealing the circuit chip on the base.

6 Claims, 6 Drawing Sheets

US 7,789,316 B2

ELECTRONIC DEVICE, ELECTRONIC APPARATUS MOUNTED WITH ELECTRONIC DEVICE, ARTICLE EQUIPPED WITH ELECTRONIC DEVICE AND METHOD OF PRODUCING ELECTRONIC DEVICE

CROSS-REFERENCE TO RELATED APPLICATION

This is a continuation application of PCT/JP2007/056079, filed on Mar. 23, 2007.

TECHNICAL FIELD

The present invention is related to an electronic device, an electronic apparatus mounted with the electronic device, an article equipped with the electronic device and a method of producing the electronic device.

BACKGROUND ART

Conventionally, there is widely known an electronic device having a base such as a printed wiring board and a circuit chip mounted on the base. This type of electronic device is used to control an electronic apparatus by being disposed within this electronic apparatus, or is used independently to exchange information with an external device. As an example of such an electronic device, there is known a RFID (Radio_Frequency_IDentification) tag that exchanges information with an external device represented by a reader/writer in a non-contact manner using radio waves. There are various types of RFID tags. As one type of RFID tag, there is proposed a tag having a structure in which a conductor pattern for radio communications and an IC chip are mounted on a base made of a plastic, a piece of paper, etc (see, for example, Japanese Laid-open Patent Publication No. 2001-156110). It has been conceived to use this type of RFID tag in such a manner that the RFID tag is adhered to an article to identify the article by exchanging information about the article with an external device.

FIG. 1 is a schematic cross-sectional diagram of an example of a conventional RFID tag.

A RFID tag 90 illustrated in FIG. 1 includes: a base 91 made of a flexible PET film or the like; an antenna 92 made of a conductor pattern and formed on the base 91; and a circuit chip 93 disposed on the antenna 92. In this circuit chip 93, a circuit for exchanging information with an external device through the antenna 92 is incorporated. The circuit chip 93 has connecting terminals 93a formed under the circuit chip 93, which are electrically connected to the antenna 92 by soldering or the like. Further, the circuit chip 93 is secured onto the base 91 with an adhesive 94. On the base 91 of the RFID tag 90, there are also provided: a potting compound 95 covering the circuit chip 93; and a ring-shaped reinforcing member 96 disposed to surround the circuit chip 93. There is also provided a covering member 97 that covers the entire tag main body including the base 91, the antenna 92, the circuit chip 93, the potting compound 95 and the reinforcing member 96. The potting compound 95 includes an inner portion 95a filling the inside of the reinforcing member 96 shaped like a ring. The inner portion 95a covers the top of the circuit chip 93 and seals the circuit chip 93 on the base 91.

There are cases where the RFID tag 90 receives a strong external force when the RFID tag 90 is used by being attached to an article made of a flexible material, such as clothing. However, since the RFID tag 90 is provided with the potting compound 95 and the reinforcing member 96 disposed around the circuit chip 93 to protect the circuit chip 93, a crack in the circuit chip 93 per se is prevented even when a pressure is applied to the RFID tag 90 in the thickness direction of the base 91.

DISCLOSURE OF INVENTION

However, if the intensity of the reinforcing member 96 is improved to strengthen the protection of the circuit chip 93, a peripheral portion of the reinforcing member 96 of the RFID tag 90 may be damaged. For example, when a bending stress is applied to the base 91, the applied stress may concentrate on an exposed part (a part surrounded by a circle indicated with a dashed line as illustrated in FIG. 1) of the antenna 92 outside the reinforcing member 96, thereby breaking the antenna 92.

A problem due to such a damage of a peripheral portion of the reinforcing member 96 is not limited to RFID tags and is common to electronic devices provided with a flexible base mounted with a circuit chip.

In view of the above circumstances, it is an object of the present invention to provide: an electronic device in which a bending stress applied to a circuit chip is reduced and breaking of a conductor pattern is avoided; an electronic apparatus mounted with the electronic device; an article equipped with the electronic device; and a method of producing the electronic device.

An electronic device of the present invention achieving the above object includes:
  a base;
  a conductor pattern formed on the base;
  a circuit chip electrically connected to the conductor pattern;
  a reinforcing member which is disposed on the base to surround the circuit chip, whose outer shape is like a ring, and which has such an internal structure that a plurality of columns extending in a thickness direction of the base are dispersed in a predetermined substrate; and
  a sealing member which fills an inside of the reinforcing member while covering a top of the circuit chip, thereby sealing the circuit chip on the base.

In the electronic device of the present invention, the sealing member has such a structure that the sealing member covers the top of the circuit chip by filling the inside of the reinforcing member in the shape of a ring, thereby sealing the circuit chip on the base. Therefore, a stress is unlikely to be applied to the circuit chip even when the base is bent, which prevents cracking and peeling of the circuit chip. Further, according to the electronic device of the present invention, the reinforcing member disposed to surround the circuit chip has such an internal structure that the columns extending in the thickness direction of the base are dispersed in the substrate. Therefore, the electronic device is prevented from deforming in response to a stress applied in the thickness direction of the base, thereby protecting the circuit chip, while the electronic device is flexibly deformable in response to a stress for bending the base. Accordingly, a break in the conductor pattern is prevented.

In the electronic device according to the present invention, preferably, the predetermined substrate is made of an elastomer, and
  the columns are made of a metallic material.

When the columns extending in the thickness direction of the base are made of a metallic material, the rigidity against a stress applied in the thickness direction of the base is improved and the shape is altered with flexibility in response to a stress by which the base is bent.

In the electronic device according to the present invention, the electronic device may be a RFID tag that causes the conductor pattern to function as a communications antenna and causes the circuit chip to carry out wireless communications via the conductor pattern.

A RFID tag used in the state of being attached to an article or a card is frequently bent. Therefore, the electronic device of the present invention is preferably applied to the RFID tag.

An electronic apparatus of the present invention achieving the above object includes:
an electronic device; and
an apparatus main section driven by an operation of the electronic device,
wherein the electronic device includes:
a base,
a conductor pattern formed on the base,
a circuit chip electrically connected to the conductor pattern,
a reinforcing member which is disposed on the base to surround the circuit chip, whose outer shape is like a ring, and which has such an internal structure that a plurality of columns extending in a thickness direction of the base are dispersed in a predetermined substrate, and
a sealing member which fills an inside of the reinforcing member while covering a top of the circuit chip, thereby sealing the circuit chip on the base.

In the electronic apparatus of the present invention, a break in the conductor pattern is prevented even when, for example, the electronic apparatus itself is bent or the electronic device is bent for repair or maintenance. Therefore, the reliability of the electronic apparatus is improved.

An article of the present invention achieving the above object includes:
an electronic device; and
an object equipped with the electronic device,
wherein the electronic device includes:
a base,
a conductor pattern formed on the base,
a circuit chip electrically connected to the conductor pattern,
a reinforcing member which is disposed on the base to surround the circuit chip, whose outer shape is like a ring, and which has such an internal structure that a plurality of columns extending in a thickness direction of the base are dispersed in a predetermined substrate, and
a sealing member which fills an inside of the reinforcing member while covering a top of the circuit chip, thereby sealing the circuit chip on the base.

For example, there are cases where an article equipped with the electronic device such as a RFID tag is bent together with the electronic device. Even in such a situation, cracking and peeling of the circuit chip as well as a break in the conductor pattern are prevented.

A method of producing an electronic device of the present invention achieving the above object is a method including:
connecting a circuit chip to a conductor pattern formed on a base;
applying an adhesive to cover a top of the circuit chip with the adhesive;
disposing a reinforcing member whose outer shape is like a ring and which has such an internal structure that a plurality of columns extending in a thickness direction of the base are dispersed in a predetermined substrate, so that the circuit chip is surrounded by the reinforcing member and an inside of the reinforcing member is filled with the adhesive; and
curing the adhesive thereby sealing the circuit chip on the base with the adhesive and fixing the reinforcing member on the base.

In the method of producing the electronic device according to the present invention, the columns extending in the thickness direction of the base are dispersed in the reinforcing member, and this reinforcing member is disposed on the base to surround the circuit chip and moreover, the adhesive in the state of filling the inside of the reinforcing member is cured. As a result, there is produced an electronic device that has rigidity against a stress applied in the thickness direction of the base and changes the shape with flexibility in response to a stress by which the base is bent.

As described above, according to the present invention, a concentration of a bending stress on the circuit chip as well as a concentration of a stress on the conductor pattern are avoided.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BEST MODE FOR CARRYING OUT THE INVENTION

Embodiments of the present invention will be described with reference to the drawings.

Figure 2:
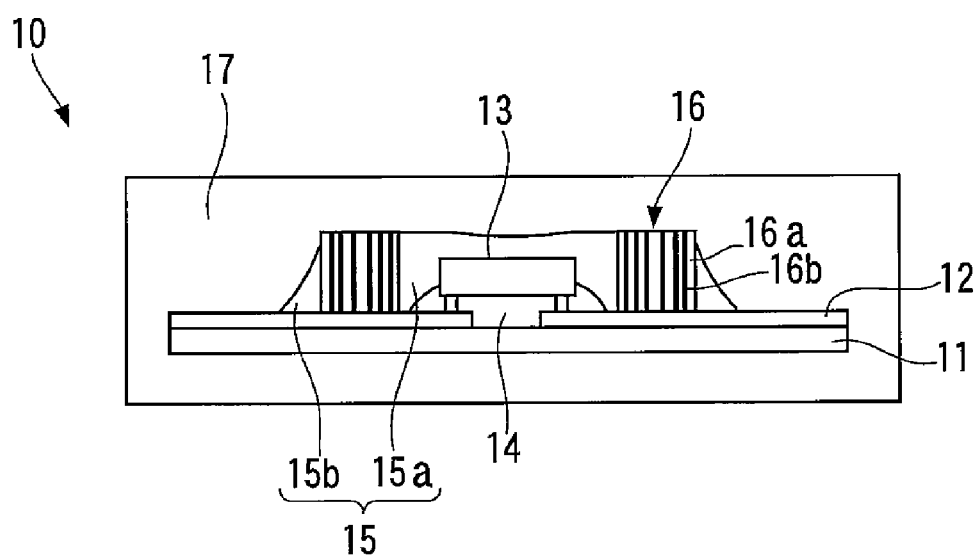
FIG. 2 is a cross-sectional view of a RFID tag that is an embodiment of the present invention.
Figure 3:
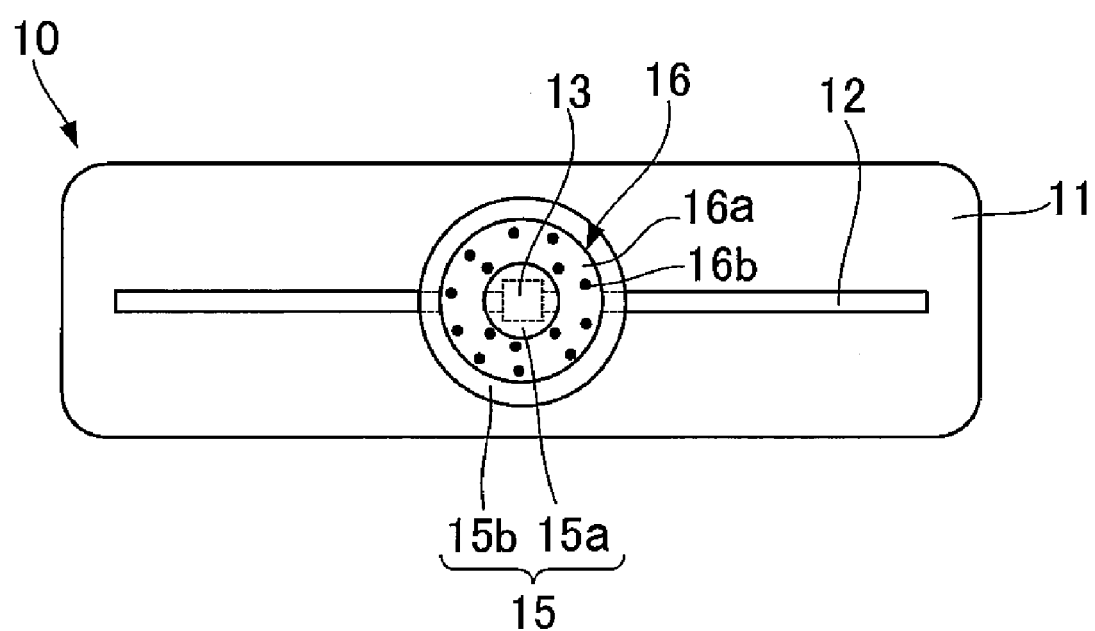
FIG. 3 is a plan view of the RFID tag that is the embodiment of the present invention.

FIG. 2 and FIG. 3 are a cross-sectional view and a plan view, respectively, of a RFID tag that is an embodiment of the electronic device of the present invention. Incidentally, a central part of the RFID tag illustrated in FIG. 2 is made larger than that illustrated in FIG. 3 so that the structure may be readily viewed.

Figure 1:
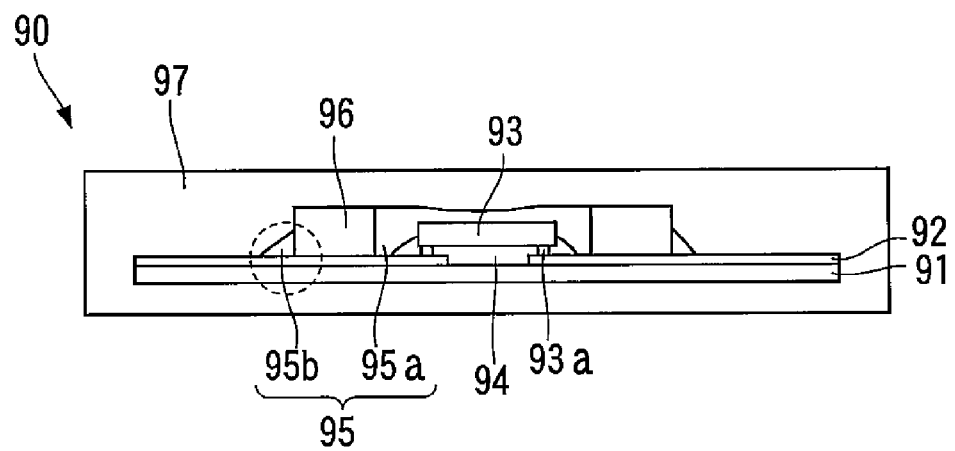
FIG. 1 is a schematic cross-sectional diagram of an example of a conventional RFID tag.

The RFID tag 10 illustrated in FIG. 2 and FIG. 3 has a reinforcing member whose structure is different from the reinforcing member of the RFID tag 90 illustrated in FIG. 1. Otherwise, the RFID tag 10 illustrated in FIG. 2 and FIG. 3 is the same as the RFID tag 90 illustrated in FIG. 1. To be more specific, an antenna 12 is formed on a flexible base 11 and a circuit chip 13 is mounted on the base 11, and the circuit chip 13 is fixed with an adhesive 14. Provided also on the base 11 are a potting compound 15 that covers the top of the circuit chip 13 and a ring-shaped reinforcing member 16 disposed to surround the circuit chip 13. Further, the entire device including the base 11, the antenna 12, the circuit chip 13, the potting compound 15 and the reinforcing member 16 is covered with a covering member 17. Incidentally, the covering member 17 is not illustrated in FIG. 3 so that the internal structure may be readily viewed.

The reinforcing member 16 has a ring-like outer shape and also has such an internal structure that columns 16b extending in the thickness direction of the base 11 are dispersed in a substrate 16a. The substrate 16a is made of an elastomer such as rubber, and each of the columns 16b is in the shape of a needle and made of a metallic material. The columns 16b penetrate the substrate 16a and extend in the thickness direction of the substrate 16a.

The potting compound 15 is divided into an inner portion 15a that fills the inside of the reinforcing member 16 and an outer portion 15b that surrounds the reinforcing member 16 from outside. The inner portion 15a of the potting compound 15 filling the inside of the reinforcing member 16 covers the top of the circuit chip 13 and seals the circuit chip 13 on the base 11.

The antenna 12 is an example of the conductor pattern according to the present invention, and the inner portion 15a of the potting compound 15 is an example of the sealing member according to the present invention.

In the RFID tag 10, the reinforcing member 16 disposed to surround the circuit chip has such an internal structure that the columns 16b extending in the thickness direction of the base 11 are dispersed in the substrate 16a. Therefore, the reinforcing member 16 is prevented from deforming due to a stress received in the direction in which the columns 16b extend, thereby protecting the circuit chip 13. At the same time, the reinforcing member 16 is flexibly deformable in response to a stress by which the base 11 is bent and thus, concentration of the bending stress on an exposed portion of the antenna 12 outside the reinforcing member 16 is alleviated, thereby preventing the antenna 12 from being broken. Further, the RFID tag 10 has such a structure that: the circuit chip 13 is surrounded by the reinforcing member 16; the top of the circuit chip 13 is covered by the inner portion 15a of the potting compound 15, which portion fills the inside of the reinforcing member 16; and the circuit chip 13 is sealed by both the inner portion 15a and the base 11. This structure prevents concentration of the stress on the circuit chip 13 as well as cracking, peeling etc. of the circuit chip 13.

Next, a method of producing the RFIF tag will be described.

Figure 4:
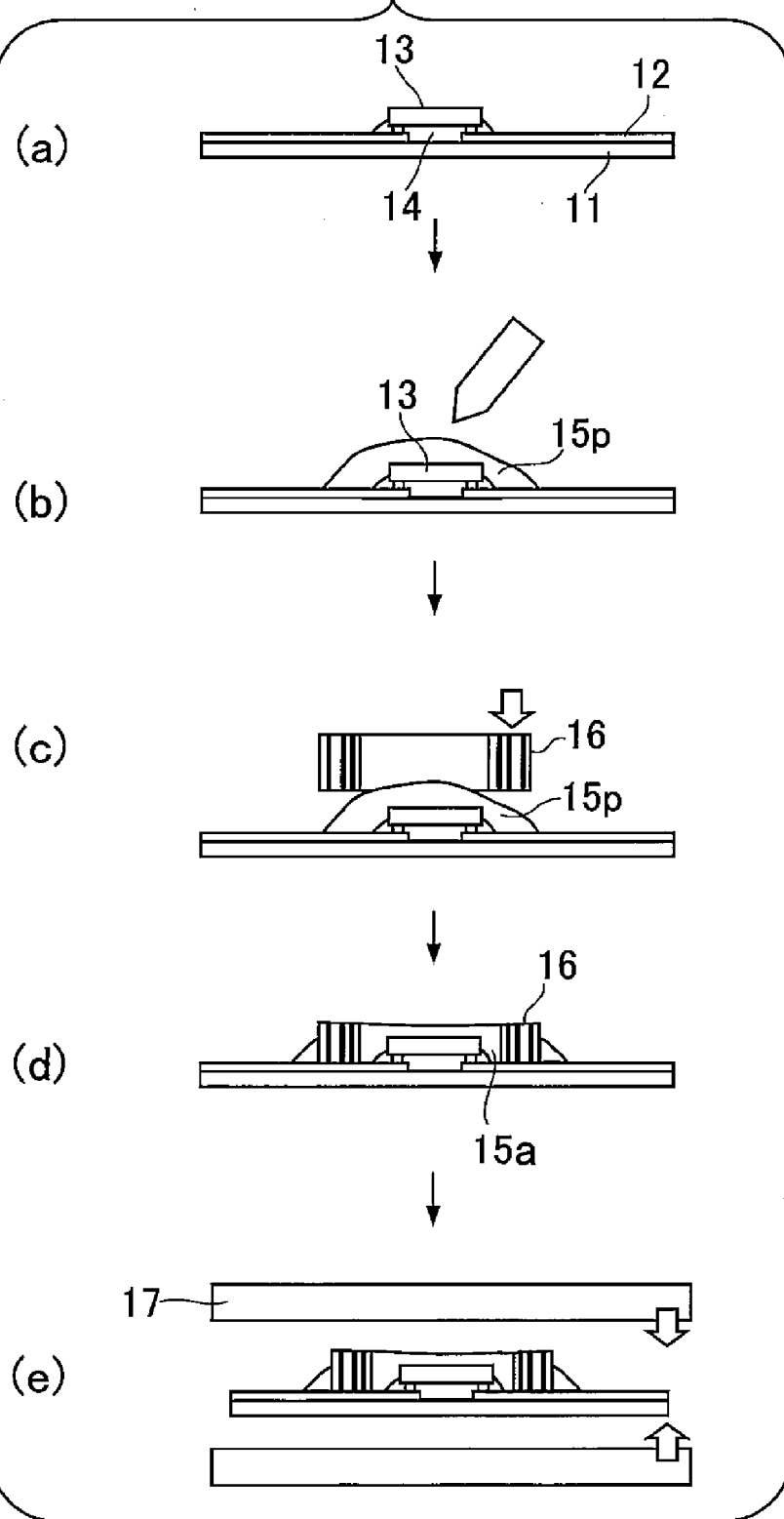
FIG. 4 is a diagram for describing a method of producing the RFID tag illustrated in FIG. 2 and FIG. 3.

FIG. 4 is a diagram for describing the method of producing the RFID tag illustrated in FIG. 2 and FIG. 3.

FIG. 4 illustrates a sequence of processes for producing the RFID tag in parts (a) through (e).

In order to obtain the RFID tag 10, first, the circuit chip 13 is connected to the antenna 12 formed on the base 11 in a connection process illustrated in part (a) of FIG. 4.

Subsequently, in an adhesive application process illustrated in part (b) of FIG. 4, a liquid potting compound 15p made of a thermosetting resin material is applied to cover the top of the circuit chip 13. The liquid potting compound 15p is also applied around the circuit chip 13.

Next, in a reinforcing-member arrangement process illustrated in parts (c) and (d) of FIG. 4, the reinforcing member 16 is disposed on the base 11 after being aligned to surround the circuit chip 13.

Here, the description by referring to FIG. 4 is temporarily stopped, and a method of producing the reinforcing member 16 will be described with reference to FIG. 5.

Figure 5:
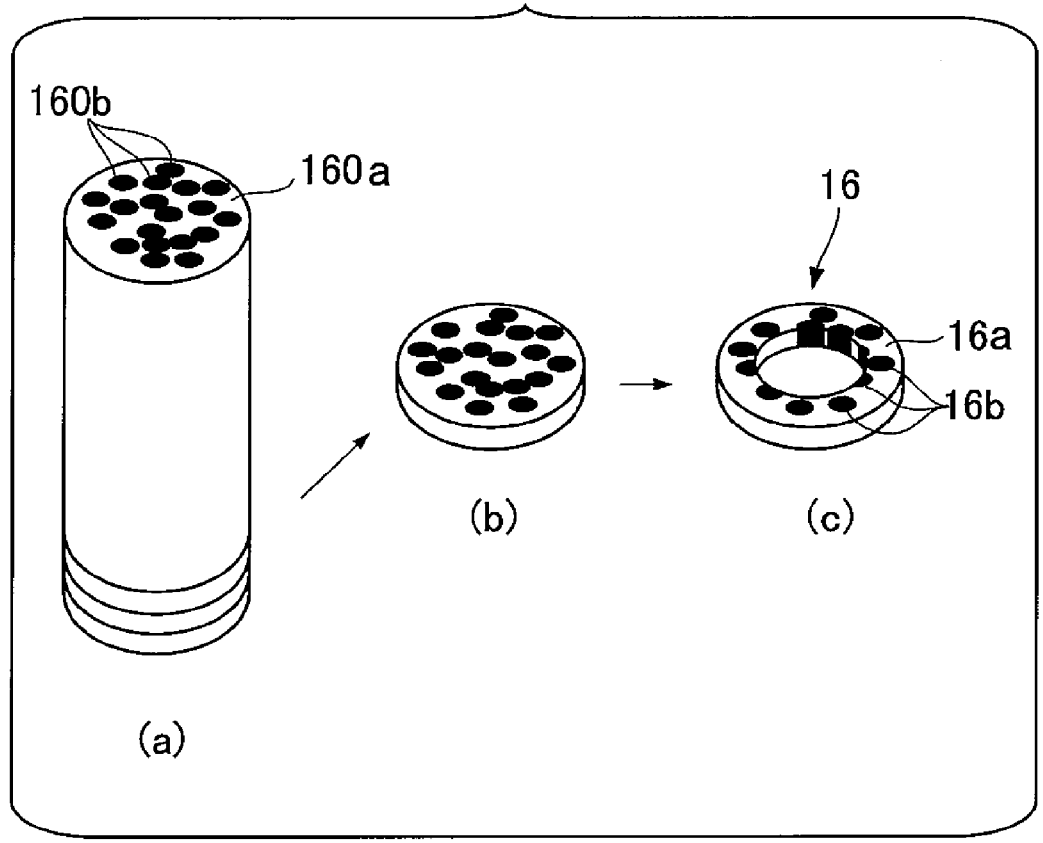
FIG. 5 is a diagram for describing the method of producing a reinforcing member illustrated in FIG. 4.

FIG. 5 is a diagram for describing the method of producing the reinforcing member illustrated in FIG. 4.

In order to produce the reinforcing member, first, metallic slim rods are arranged to face in the same direction and gathered by a substrate made of an elastomer to be in the shape of a cylinder as illustrated in part (a) of FIG. 5. Subsequently, as illustrated in part (b) of FIG. 5, the gathered rods in the shape of a cylinder are sliced to produce a disk-like object. Next, as illustrated in part (c) of FIG. 5, a hole is formed in the center of the disk-like object, so that there is obtained the reinforcing member 16 in which the columns 16b are dispersed in the substrate 16a.

Now, returning back to FIG. 4, the description will be continued. As illustrated in parts (c) and (d) of FIG. 4, the reinforcing member 16 is disposed to sink into the liquid potting compound 15p, so that the potting compound 15p is divided into two parts to be respectively in two locations; the inner side and the outer side of the reinforcing member 16. Subsequently, as illustrated in part (d), the liquid potting compound 15p is cured by being heated. As a result, the inner portion 15a is formed in the inside of the reinforcing member 16.

Next, in a covering process illustrated in part (e) of FIG. 4, the front side and the back side of the base 11 are covered with the covering member 17. The adhesion of the covering member 17 is achieved by heating and pressurizing the covering member 17. Upon completion of the covering process, the RFID tag 10 illustrated in FIG. 2 is obtained.

As an example of applications for the RFID tag described above, there will be described clothing to which the RFID tag 10 is attached. This clothing is an embodiment of the article to which the electronic device of the present invention is attached.

Figure 6:
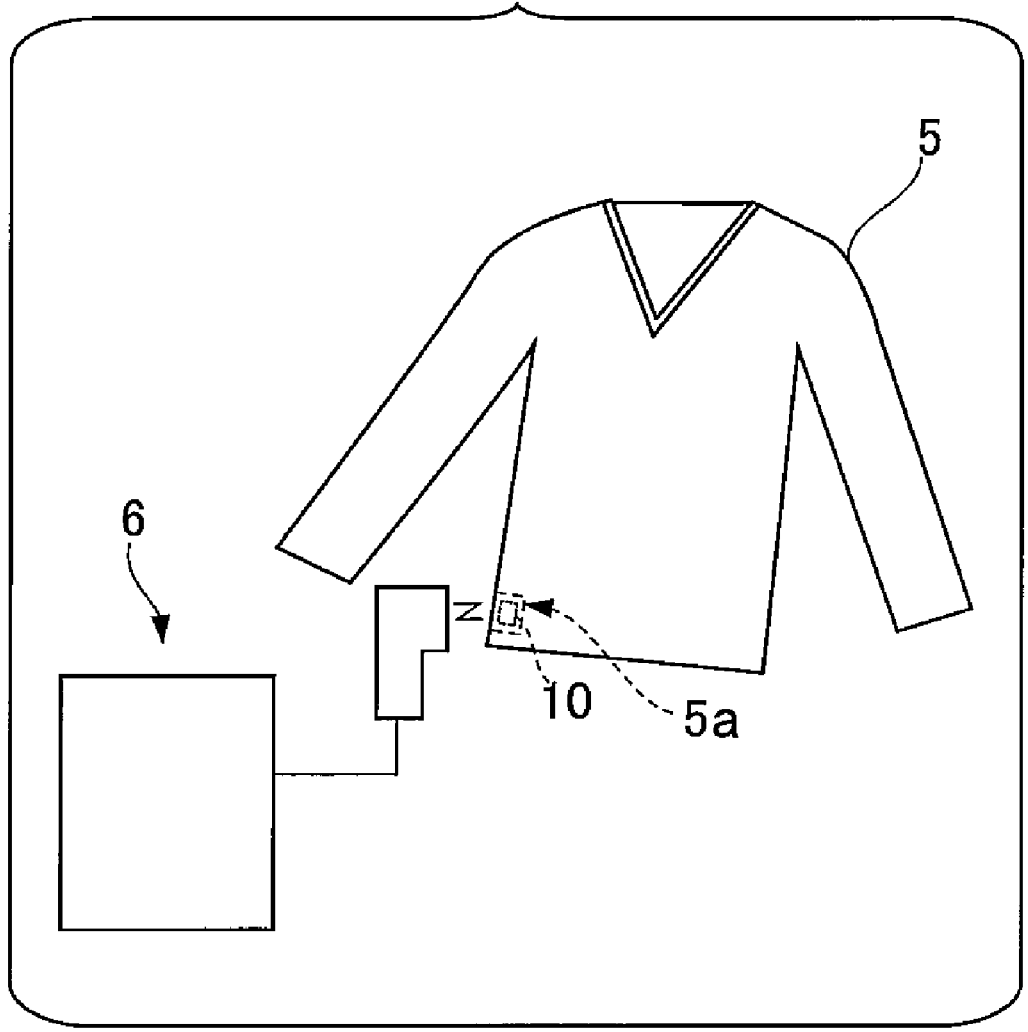
FIG. 6 is a diagram for describing a method of producing clothing to which the RFID tag is attached.

FIG. 6 is a diagram for describing a method of producing the clothing to which the RFID tag is attached.

For example, the RFID tag 10 illustrated in FIG. 2 and FIG. 3 is fixed to a tag 5a of clothing 5 as illustrated in FIG. 6 with adhesion or the like. In the RFID tag 10 attached to clothing 5, information representing attributes of clothing 5 is stored. For example, attribute information about clothing 5 such as a JAN code is transmitted from an information writing device 6 to the RFID tag 10 through wireless communications, and then the attribute information is stored in the circuit chip 13 (see FIG. 2).

In the above-described embodiment, the RFID tag has been described as an example of the electronic device. However, the electronic device of the present invention is not limited to the RFID tag and may be applied to, for example, a printed circuit board device where a circuit chip mounted on a flexible base is provided.

Figure 7:
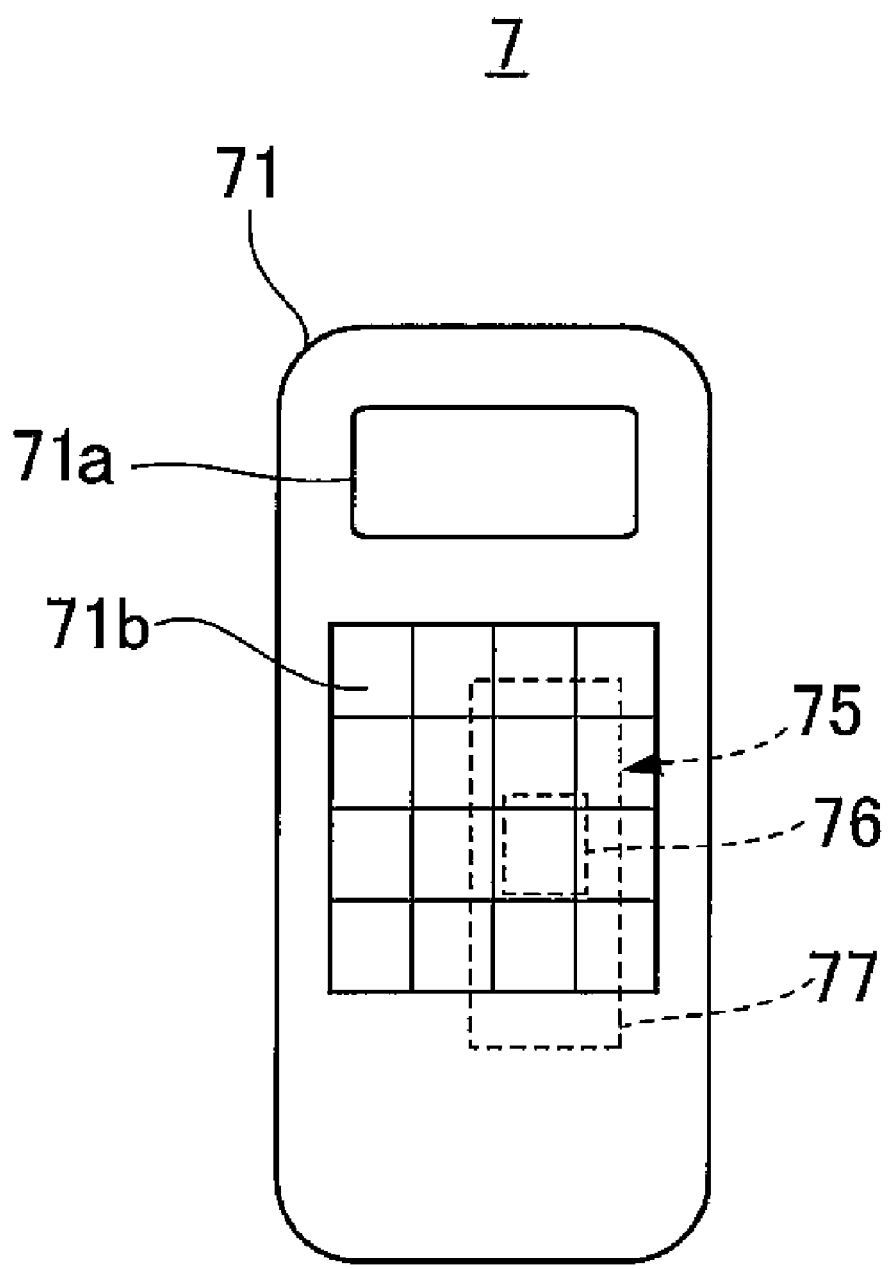
FIG. 7 is a schematic diagram of a printed circuit board device that is an embodiment of the present invention and an electronic desk calculator where the printed circuit board device is implemented.

FIG. 7 is a schematic diagram of a printed circuit board device that is an embodiment of the present invention and an electronic desk calculator where the printed circuit board device is implemented.

An electronic desk calculator 7 illustrated in FIG. 7 has a calculator main section 71 and a printed circuit board device 75 implemented on the calculator main section 71. The printed circuit board device 75 has a structure similar to that of the RFID tag 10 illustrated in FIG. 2 and FIG. 3. In other words, a circuit chip 76 is mounted on a flexible printed circuit 77 (FPC 77) serving as a base. Further, although illustration is omitted, the printed circuit board device 75 has such a structure that: a reinforcing member having a substrate where columns extending in the thickness direction of the base are dispersed is placed on the FPC 77 to surround the circuit chip; and a sealing member covers the top of the circuit chip 76 and fills the inside of the reinforcing member, so that the circuit chip 76 is sealed by the FPC 77. However, the printed circuit board device 75 has features different from the RFID tag 10 illustrated in FIG. 2, which are: the circuit chip of the printed circuit board device 75 has the function of controlling the calculator main section 71; and a wiring pattern for transmitting signals between the circuit chip 76 and the calculator main section 71 is formed instead of an antenna. The calculator main section 71 is provided with a display section 71a for providing various types of displays and operation keys 71b, which are driven based on the operations of the circuit chip 76. In the electronic desk calculator 7 mounted with the printed circuit board device 75, a break in the wiring pattern on the printed circuit board device 75 is prevented even when the calculator main section 71 is bent.

Incidentally, there has been described the case in which the calculator main section 71 of the electronic desk calculator 7 is bent. However, the present invention is not limited to this case and may be applied to, for example, a case of an electronic apparatus having a main unit with a hard case where an electronic device in the state of being bent is disposed. Alternatively, the present invention may be applied to a case of an electronic apparatus with an electronic device that is prone to warp when removed for repair or maintenance. Also, the present invention is not limited to the electronic desk calculator and may be applied to various types of electronic apparatus such as a portable telephone on which an electronic device with a flexible base mounted with a circuit chip is implemented.

Further, although the embodiments each having a covering member have been described above, the electronic device of the present invention is not limited to these embodiments and may have no covering member.

Furthermore, in the embodiments described above, the elastomer has been adopted as an example of the material forming the substrate of the reinforcing member. However, the electronic device of the present invention is not limited to this example and the material of the substrate may be resins such as acryl (PMAA), polyacetal (POM), polyphenylene sulfide (PPS), polypropylene (PP), ABS resin (ABS) and polyvinyl chloride (PVC).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device, comprising:
   a base;
   a conductor pattern formed on the base;
   a circuit chip electrically connected to the conductor pattern;
   a reinforcing member which is disposed on the base to surround the circuit chip, whose outer shape is like a ring, and which has such an internal structure that a plurality of columns extending in a thickness direction of the base are dispersed in a predetermined substrate; and
   a sealing member which fills an inside of the reinforcing member while covering a top of the circuit chip, thereby sealing the circuit chip on the base.

2. The electronic device according to claim 1, wherein the predetermined substrate is made of an elastomer, and
   the columns are made of a metallic material.

3. The electronic device according to claim 1, wherein the electronic device is a RFID tag that causes the conductor pattern to function as a communications antenna and causes the circuit chip to carry out wireless communications via the conductor pattern.

4. An electronic apparatus, comprising:
   an electronic device; and
   an apparatus main section driven by an operation of the electronic device,
   wherein the electronic device comprises:
   a base,
   a conductor pattern formed on the base,
   a circuit chip electrically connected to the conductor pattern,
   a reinforcing member which is disposed on the base to surround the circuit chip, whose outer shape is like a ring, and which has such an internal structure that a plurality of columns extending in a thickness direction of the base are dispersed in a predetermined substrate, and
   a sealing member which fills an inside of the reinforcing member while covering a top of the circuit chip, thereby sealing the circuit chip on the base.

5. An article, comprising:
   an electronic device; and
   an object equipped with the electronic device,
   wherein the electronic device comprises:
   a base,
   a conductor pattern formed on the base,
   a circuit chip electrically connected to the conductor pattern,
   a reinforcing member which is disposed on the base to surround the circuit chip, whose outer shape is like a ring, and which has such an internal structure that a plurality of columns extending in a thickness direction of the base are dispersed in a predetermined substrate, and
   a sealing member which fills an inside of the reinforcing member while covering a top of the circuit chip, thereby sealing the circuit chip on the base.

6. A method of producing an electronic device, the method comprising:
   connecting a circuit chip to a conductor pattern formed on a base;
   applying an adhesive to cover a top of the circuit chip with the adhesive;
   disposing a reinforcing member whose outer shape is like a ring and which has such an internal structure that a plurality of columns extending in a thickness direction of the base are dispersed in a predetermined substrate, so that the circuit chip is surrounded by the reinforcing member and an inside of the reinforcing member is filled with the adhesive; and
   curing the adhesive thereby sealing the circuit chip on the base with the adhesive and fixing the reinforcing member on the base.

* * * * *